(12) United States Patent
Lee et al.

(10) Patent No.: US 9,484,297 B2
(45) Date of Patent: Nov. 1, 2016

(54) SEMICONDUCTOR DEVICE HAVING NON-MAGNETIC SINGLE CORE INDUCTOR AND METHOD OF PRODUCING THE SAME

(71) Applicant: GLOBALFOUNDRIES Inc., Grand Cayman (KY)

(72) Inventors: Ki Young Lee, Schenectady, NY (US); Moosung M. Chae, Englewood Cliffs, NJ (US); Woo Sik Kim, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 5 days.

(21) Appl. No.: 14/656,770

(22) Filed: Mar. 13, 2015

(65) Prior Publication Data
US 2016/0268195 A1 Sep. 15, 2016

(51) Int. Cl.
| H01L 27/08 | (2006.01) |
| H01L 23/522 | (2006.01) |
| H01L 21/768 | (2006.01) |
| H01L 21/02 | (2006.01) |
| H01L 23/532 | (2006.01) |
| H01L 49/02 | (2006.01) |

(52) U.S. Cl.
CPC ..... *H01L 23/5227* (2013.01); *H01L 21/02126* (2013.01); *H01L 21/02362* (2013.01); *H01L 21/76802* (2013.01); *H01L 21/76843* (2013.01); *H01L 21/76877* (2013.01); *H01L 23/5226* (2013.01); *H01L 23/53238* (2013.01); *H01L 23/53252* (2013.01); *H01L 23/53266* (2013.01); *H01L 23/53295* (2013.01); *H01L 28/10* (2013.01)

(58) Field of Classification Search
CPC ..................... H01L 21/02126; H01L 23/5227
See application file for complete search history.

(56) References Cited

U.S. PATENT DOCUMENTS

| 6,114,937 | A | 9/2000 | Burghartz et al. |
| 6,573,148 | B1 | 6/2003 | Bothra |
| 6,717,232 | B2 | 4/2004 | Bothra |
| 7,075,167 | B2 | 7/2006 | Harris et al. |
| 2013/0271240 | A1 | 10/2013 | Liu et al. |

*Primary Examiner* — Wael Fahmy
*Assistant Examiner* — Sarah Salerno
(74) *Attorney, Agent, or Firm* — Ditthavong & Steiner, P.C.

(57) ABSTRACT

Integrated circuits with single core inductors and methods for producing them are provided. Embodiments include forming a trench in a dielectric layer; forming a first metal-oxide hard mask by disposing a metal hard mask and an oxide hard mask over the dielectric layer and in strips in the trench; forming metal line trenches through the first metal-oxide hard mask and into the first dielectric layer on opposite sides of the inductor trench and first vias; filling the first metal line trenches, first vias, and trench; forming another dielectric layer and a second metal-oxide hard mask over the filled trench; forming a second trench through the second metal-oxide hard mask and into the second dielectric layer and second metal line trenches and second vias; and filling the second metal line trenches, second vias, and second trench.

14 Claims, 13 Drawing Sheets

FIG. 1B
BACKGROUND

FIG. 1A
BACKGROUND

SEMICONDUCTOR DEVICE HAVING NON-MAGNETIC SINGLE CORE INDUCTOR AND METHOD OF PRODUCING THE SAME

TECHNICAL FIELD

The present disclosure relates to integrated circuit inductors and methods for making thereof, and more particularly, to non-magnetic single core inductors with a high quality Q factor.

BACKGROUND

The current revolution in wireless communications and the need for smaller wireless communications devices has spawned significant efforts directed to the optimization and miniaturization of radio communications electronic devices. Digital and analog components and circuits are included in silicon (Si) based integrated circuits (ICs) incorporated in these electronic devices. Passive components, such as inductors, resistors, capacitors and transformers, play a necessary role in the operation of these electronic devices, and thus efforts are directed toward reducing the size and improving the performance and fabrication efficiency of such passive components.

Existing technology provides a process of making spiral inductors which do not have any cores and are made with one single layer metal which is extremely thick which normally requires a 2 μm thickness to meet the Q factor. Moreover, the existing processes are complex and result in a thick metal inductor which is not ideal for current trends in miniaturization of electronic devices. Spiral core inductors having a core are produced with complex and less efficient processes and also result in metal inductors having a 3 μm thickness.

Figure 1A:
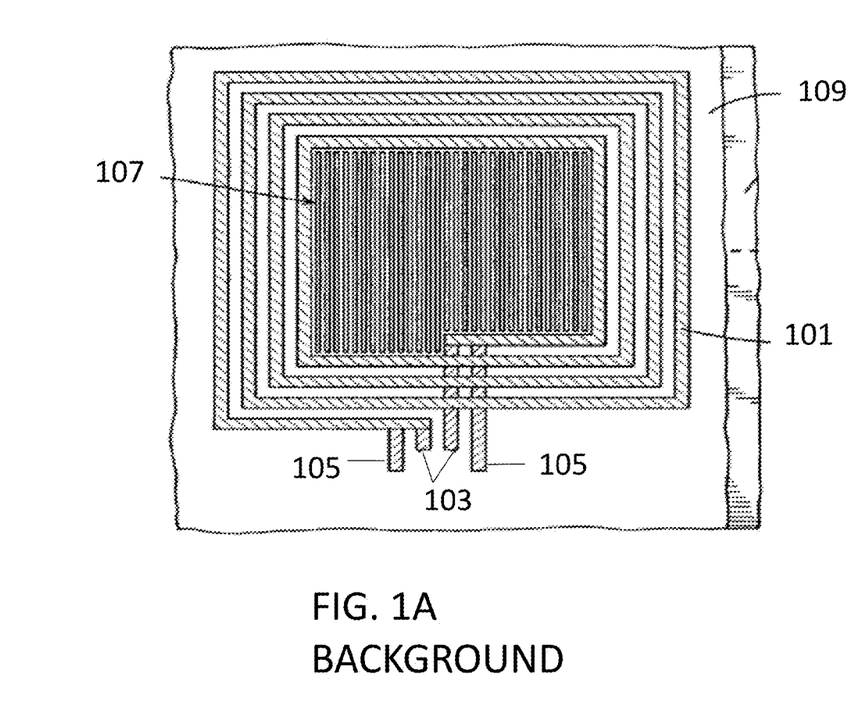
FIGS. 1A and 1B respectively illustrate conventional spiral and toroidal transformers with cores.

An example of existing damascene spiral transformer having vertically stacked spiral coils is shown in FIG. 1A. Spiral coils or metal lines 101 are laterally stacked over each other to form a spiral transformer. The spiral transformer has a pair of underpass contacts 103 and a pair of overpass contacts 105. A core including dummy lines 107 are present at the center region of the spiral inductor surrounded by the metal lines 101. During the etching of the dielectric 109, trenches are formed in the dielectric layer for both the metal lines 1 and the ferromagnetic core lines 107.

Figure 1B:
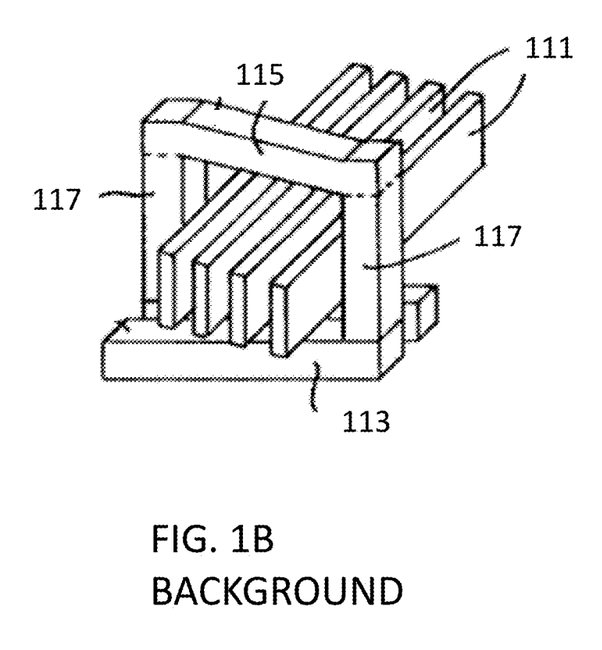

An example of existing damascene toroidal transformer with a ferromagnetic core is shown in FIG. 1B. The ferromagnetic strips 111 are formed within the dielectric layer of the core. The ferromagnetic strips 111 are formed using a damascene process and do not electrically contact the metal sections 113, 115. A dual-damascene Cu-process is used to fill the metal filled vias 117, and top Cu sections 115 are formed to close the toroidal coil loops.

A need exists for a less complex methodology enabling production of a single core inductor having a high quality Q factor and an ideal thickness for usage in semiconductor devices and the resulting device.

SUMMARY

An aspect of the present disclosure is to efficiently manufacture a single core inductor having a high quality Q factor and an ideal thickness for usage in semiconductor devices.

Another aspect of the present disclosure is a single core inductor having a high quality Q factor and an ideal thickness for usage in semiconductor devices.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming an inductor trench in a first dielectric layer; forming a first metal-oxide hard mask by disposing a metal hard mask and an oxide hard mask over the first dielectric layer and in strips in the inductor trench; forming first metal line trenches through the first metal-oxide hard mask and into the first dielectric layer on opposite sides of the inductor trench and first vias through both the first metal-oxide hard mask and the first dielectric layer; filling the first metal line trenches, first vias, and inductor trench and removing the first metal-oxide hard mask from the first dielectric layer; forming a second dielectric layer and a second metal-oxide hard mask over the filled inductor trench, first vias and first metal line trenches and the first dielectric layer; forming a second trench through the second metal-oxide-metal hard mask and into the second dielectric layer and second metal line trenches and second vias through both the second metal-oxide hard mask and the second dielectric layer down to the first metal line trenches and first vias, respectively; and filling the second metal line trenches, second vias, and second trench.

Aspects include disposing the first dielectric layer over an interlayer dielectric (ILD), the ILD including a contact therethrough. Further aspects include disposing a diffusion barrier layer between the ILD and the dielectric layer. Yet other aspects include disposing a hard mask over the first dielectric prior to forming the inductor trench. Aspects include the metal in the metal-oxide hard mask forming the inductor bottom metal, the filling of the inductor trench including filling the inductor trench with an inductor core metal, and the filling of the second trench including filling the second trench with an inductor top metal. Further aspects include the conformal oxide liner including tetraethyl orthosilicate (TEOS). Additional aspects include forming the inductor trench with a round or u-shaped bottom. Still further aspects include filling the first metal line trenches, first vias, and inductor trench by a damascene or dual damascene process. In yet other aspects, prior to filling the first metal line trenches, first vias, and inductor trench, depositing a barrier layer in the first metal line trenches, first vias, and inductor trench. Aspects include the filling the first metal line trenches, first vias, and inductor trench including: filling the first metal line trenches, first vias, and inductor trench with copper, tungsten or gold. Other aspects include the filling the second metal line trenches, second vias, and second trench including filling with a conductive material selected from copper, tungsten or gold.

Another aspect of the present disclosure is a device including an inductor trench formed in a first dielectric layer, the inductor trench having a bottom inductor metal and an oxide layer formed on the bottom inductor metal both etched to form strips; first metal line trenches formed and filled on opposite sides of the inductor trench; a single inductor core over the oxide layer; a diffusion barrier over the inductor core, first metal line trenches, and first dielectric layer; a second dielectric layer over the diffusion barrier and having a second trench over the inductor trench; second metal line trenches and vias through the second dielectric layer on opposite sides of the inductor trench extending down to the first metal line trenches with a portion of the second dielectric layer and diffusion barrier positioned between the second metal line trenches and vias; and an inductor top metal formed in the second trench, second metal line trenches and vias.

Aspects include the bottom inductor metal including titanium nitride (TiN) and having a u-shaped or round bottom. Other aspects include the inductor top metal and inductor core are each formed on a barrier liner. Yet other aspects include the oxide layer including TEOS. Further aspects include the inductor core and inductor top metal including copper, tungsten or gold. Additional aspects include the diffusion barrier includes silicon nitride (SiN).

Yet another aspect of the present disclosure is a method including disposing a dielectric layer over an ILD, the ILD including a contact; forming an inductor trench in the first dielectric layer; forming a first metal-oxide hard mask over the first dielectric layer and in the inductor trench by disposing a metal hard mask followed by an oxide hard mask; etching the first metal-oxide hard mask in the inductor trench, forming strips; forming first metal line trenches through the first metal-oxide hard mask on opposite sides of the inductor trench, while masking the inductor trench with a conformal oxide liner; etching through the metal-oxide hard mask to extend some first metal line trenches into the first dielectric layer and other first metal line trenches through the first dielectric layer to form; removing the first metal-oxide hard mask from the first dielectric layer; filling the first metal line trenches, first vias, and inductor trench with a first metal; forming a diffusion barrier, a second dielectric layer, and a second metal-oxide hard mask over the metal filled inductor trench, first vias, and first metal lines and the second dielectric layer; forming a second trench through the second metal-oxide hard mask into the second dielectric layer; etching through the second metal-oxide hard mask, second dielectric layer, and diffusion barrier to form second metal line trenches on opposite sides of the second trench and second vias down to the first metal line trenches and first vias, respectively, wherein a portion of the second dielectric layer and diffusion barrier remains over the inductor trench filled with the first metal; and filling the second metal line trenches, second vias, and second trench with a second metal.

Aspects include prior to filling the first metal line trenches, first vias, and inductor trench with a first metal, depositing a barrier layer in the first metal line trenches, first vias, and inductor trench. Other aspects include filling the first metal line trenches, first vias, and inductor trench with the first metal by a damascene or dual damascene process.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of the overly complex methods in producing a single core inductor. The present invention provides a less complex method for producing a single core inductor having a high quality Q factor and an ideal thickness for usage in semiconductor devices requiring further miniaturization. Methodology in accordance with embodiments of the present disclosure includes producing a single core inductor that utilizes existing technology with only two additional patterning layers which results in a less complex process compared to conventional processes used to produce metal conductors which have an undesirable thickness.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2:
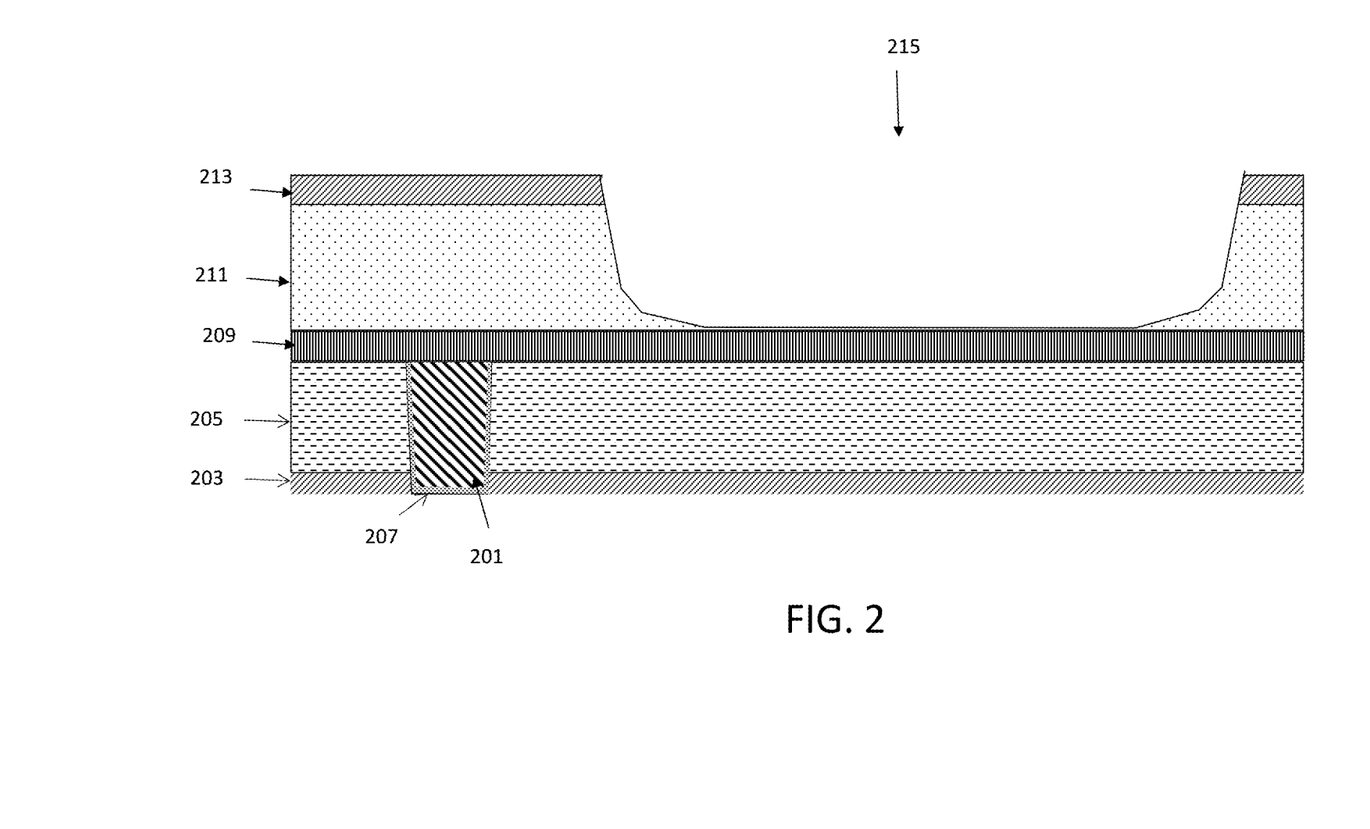
FIGS. 2 through 12 illustrate a process flow for forming a single core inductor in accordance with an exemplary embodiment.

FIGS. 2 through 12 schematically illustrate a process flow in accordance with an exemplary embodiment. As illustrated in FIG. 2, an electrical contact 201 overlies an electrical component (not shown for illustrative convenience) on or within a substrate 203. As used herein, the term "substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate 203. The silicon substrate 203 may be a bulk silicon wafer (as illustrated) or may be a thin layer of silicon on an insulating layer (commonly known as silicon-on-insulator or SOI) that, in turn, is supported by a carrier wafer.

The electrical contact 201 may be electrically connected to a source, drain, and/or gate of a transistor, or to different electronic components (not shown for illustrative convenience). An ILD 205 overlies the substrate 203, and the electrical contact 201 extends through the ILD 205. As used herein, the term "overlying" means "over" such that an intervening layer may lie between the ILD 205 and the substrate 203, and "on" indicates physically contact between the two elements. The ILD 205 is an insulating material, such as, for example, $SiO_2$, silicon nitride, or the like, and the contact 201 is an electrically conductive material, such as copper, tungsten, or the like and can include a barrier layer 207 surrounding the side and bottom surfaces of the contact 201.

An etch stop layer 209 is formed overlying the ILD 205 and the contact 201. The etch stop layer 209 may be silicon nitride, but other materials can also be used. For example, an etch stop layer with the general formula $SiC_xN_yH_z$ is useful in preventing copper migration, such as is common during annealing. Thus, etch stop layer 209 serves as a diffusion barrier layer. The layer of $SiC_xN_yH_z$ can be deposited at about 1 to 10 Torr of pressure, and a temp of 100 to 400 degrees centigrade (° C.) using 2,2, 5,5,-tetramethyl-2,5-disila-1-azacyclopentane as a precursor. The precursor is a cyclic molecule containing 1 N atom, 2 Si atoms and 2 C atoms in a 5 member ring. Other materials can also be used in the etch stop layer 209.

A dielectric layer 211 is formed overlying the etch stop layer 209. As such, the dielectric layer 211 also overlies the ILD 205, the substrate 203, and other components underlying the etch stop layer 209. The dielectric layer 211 is, for example, silicon dioxide ($SiO_2$), but other electrically insulating materials can also be used. The $SiO_2$ for the dielectric layer 211 may be deposited using octamethylcyclotetrasiloxane (OMCTS) as a precursor, for instance with silane with a plasma provided at 50 watts (W) to 3000 W of radio frequency (RF) power at a frequency of about 13.56 MHz or 350 KHz. This exposure is followed with an oxygen purge using an oxygen containing gas, such as oxygen gas or nitrous oxide, and a plasma provided at 50 W to 3000 W for 0.1 seconds to 600 seconds. The OMCTS and purge steps can be repeated until the dielectric layer 211 is at the desired thickness, such as 50 nanometers (nm) to 500 nm. Alternatively, the dielectric layer 211 may be deposited by plasma enhanced chemical vapor deposition (PECVD) using dichlorosilane, silane, or TEOS as precursors, or other known lower dielectric constant (low-k) $SiO_2$ deposition techniques.

A hard mask layer 213 is optionally formed overlying the dielectric layer 211. The hard mask layer 213 may, for example, be $SiO_2$ formed using ozone and TEOS as precursors in a chemical vapor deposition (CVD) at less than atmospheric pressure, but other materials or other methods of forming $SiO_2$ can also be used. The hard mask layer 213 and the dielectric layer 211 are both electrically insulating materials. As shown in FIG. 2, an inductor trench 201 is through the hard mask layer 213, if present, and through the dielectric layer 211 is formed to the etch stop layer 209. A layer of photoresist (not shown for illustrative convenience) may be formed and patterned to expose the hard mask layer 213 for the inductor trench 215. The inductor trench 215 is formed using an etchant selective to the material of the dielectric layer 211, and the hard mask layer 213, if present. For example, with a $SiO_2$ dielectric layer 211, the inductor trench 215 may be formed with a reactive ion etch using carbon tetrafluoride, or a combination of the reactive ion etch with a wet etch using hydrofluoric acid, but many other etchants and etch techniques can alternatively be used. The inductor trench 215 may stop on top of the etch stop layer 209, or it may extend partially into or fully through the etch stop layer 209 The etch stop layer 209 may function as an etch stop during the formation of the inductor trench 215. The inductor trench 215 is formed overlying the substrate 203 and the ILD 205, and the inductor trench 215 is offset from the contact 207 such that inductor trench 215 is not directly over the contact 207. The inductor trench 215 may overlie one or more electronic components (not shown for illustrative convenience). The inductor trench 215 is formed to have a rounded bottom or u-shape and the wet etch can be used to enhance the rounded shape.

Figure 3:
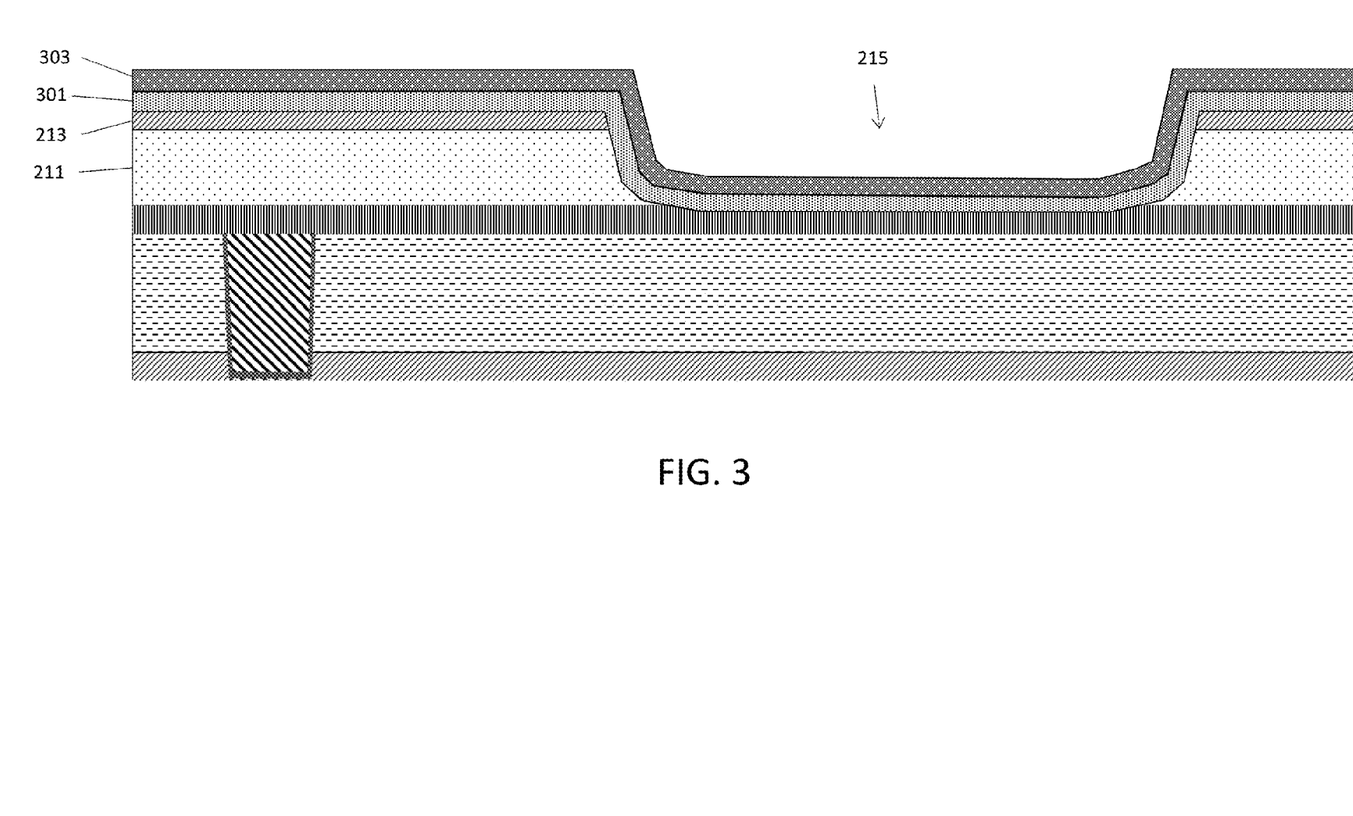

Adverting to FIG. 3, a metal hard mask 301 is formed overlying the dielectric layer 211 and the mask layer 213 (if present), as well as within the u-shaped inductor trench 215. The metal hard mask 301 is formed from an electrically conductive metallic material. For example, the first metal hard mask 301 is TiN, but other materials can also be used. TiN can be formed by CVD using tetramethylamidotitanium and nitrogen trifluoride at a pressure of 0.1 to 10 torr and a temperature of about 500° C., but other deposition processes are also possible. The metal hard mask 301 is conformally deposited, as shown in FIG. 3.

As further shown in FIG. 3, an oxide hard mask 303 is formed overlying the metal hard mask 301 the oxide hard mask 303 may be conformally formed from $SiO_2$, which may be deposited using TEOS, as described above. Other insulating materials can alternatively be used for the oxide hard mask 303. The oxide hard mask 303 is formed with a thickness and a dielectric constant to provide the desired inductor performance for the particular application, as described more fully below. For example, the oxide hard mask 303 may have a thickness of from 5 nm to 50 nm.

Figure 4:
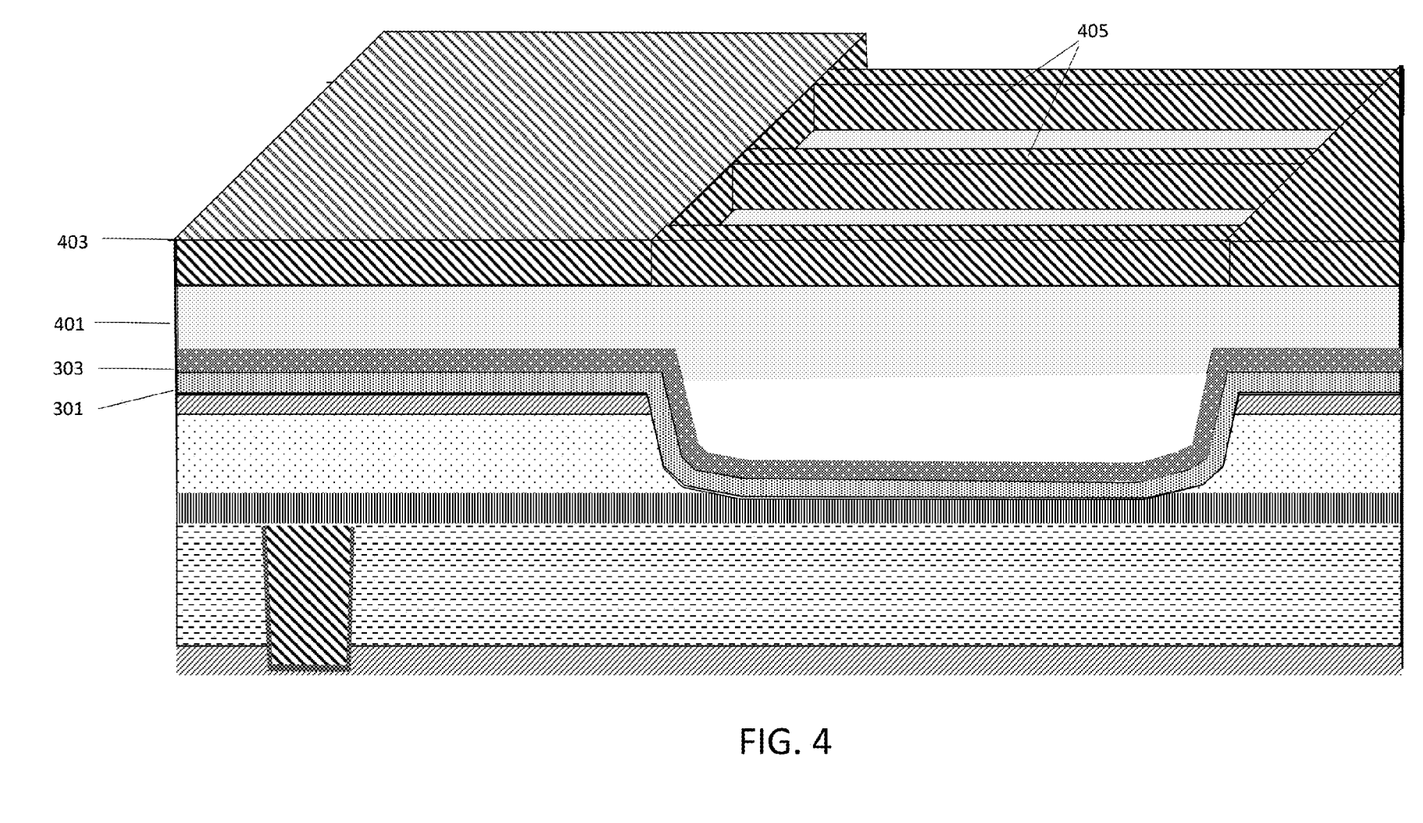
Figure 5:
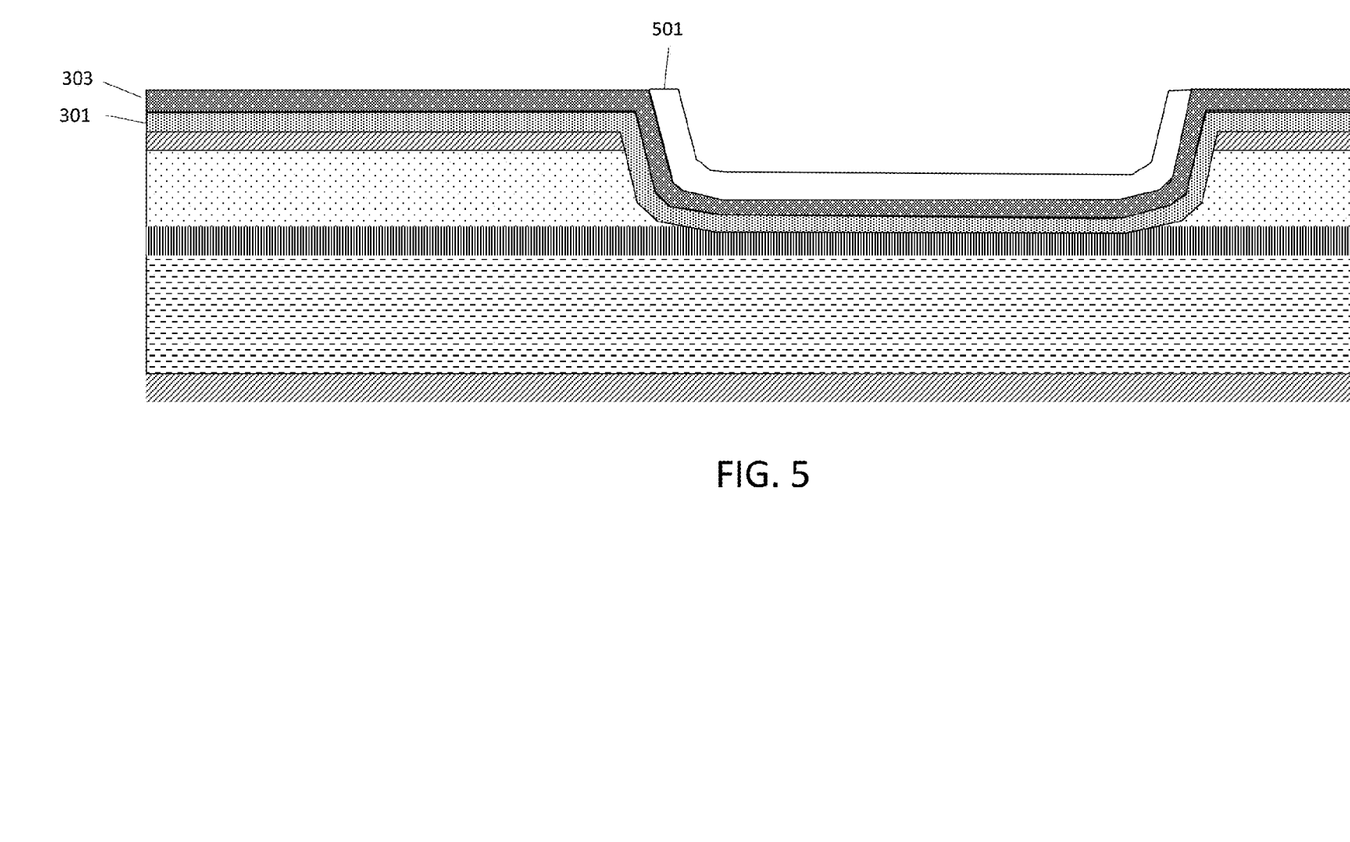

Referring to FIG. 4, an inductor bottom is formed in the inductor trench 215. A bottom anti-reflective coating (BARC) 401 is deposited. The BARC layer may be either organic or inorganic. The BARC layer can be made of a material such as TiN, which is anti-reflective and paramagnetic. A photoresist 403 is formed and patterned overlying the BARC layer 401. The photoresist 403 is, for example, $SiO_2$ that may be formed by PECVD using silane and nitrous oxide at a temperature of 300° C. to 400° C. The BARC layer 401 provides a smooth, flat upper surface for the photoresist 403, which improves the subsequent lithographic accuracy. The inductor bottom is then etched through photoresist 403, BARC layer 401, metal hard mask 301 and oxide hard mask 303, resulting in strips of hard mask 301/303 corresponding to portions 405 of the photoresist 403. The BARC layer 401 is subsequently removed. Referring to FIG. 5, a conformal oxide layer 501 is formed, and excess material is removed from outside the inductor trench 215, such as by chemical mechanical planarization (CMP) or etch back. Thus, the oxide layer 501 remains only in the inductor trench after planarization, as illustrated in FIG. 5. The upper surface of the inductor trench 215 with the conformal oxide layer formed therein becomes substantially coplanar with an upper surface of the oxide hard mask 303 following the planarization step. The conformal oxide layer 501 is deposited to a thickness of 5 nm to 50 nm or ¼ to ⅓ the trench depth.

Figure 6:
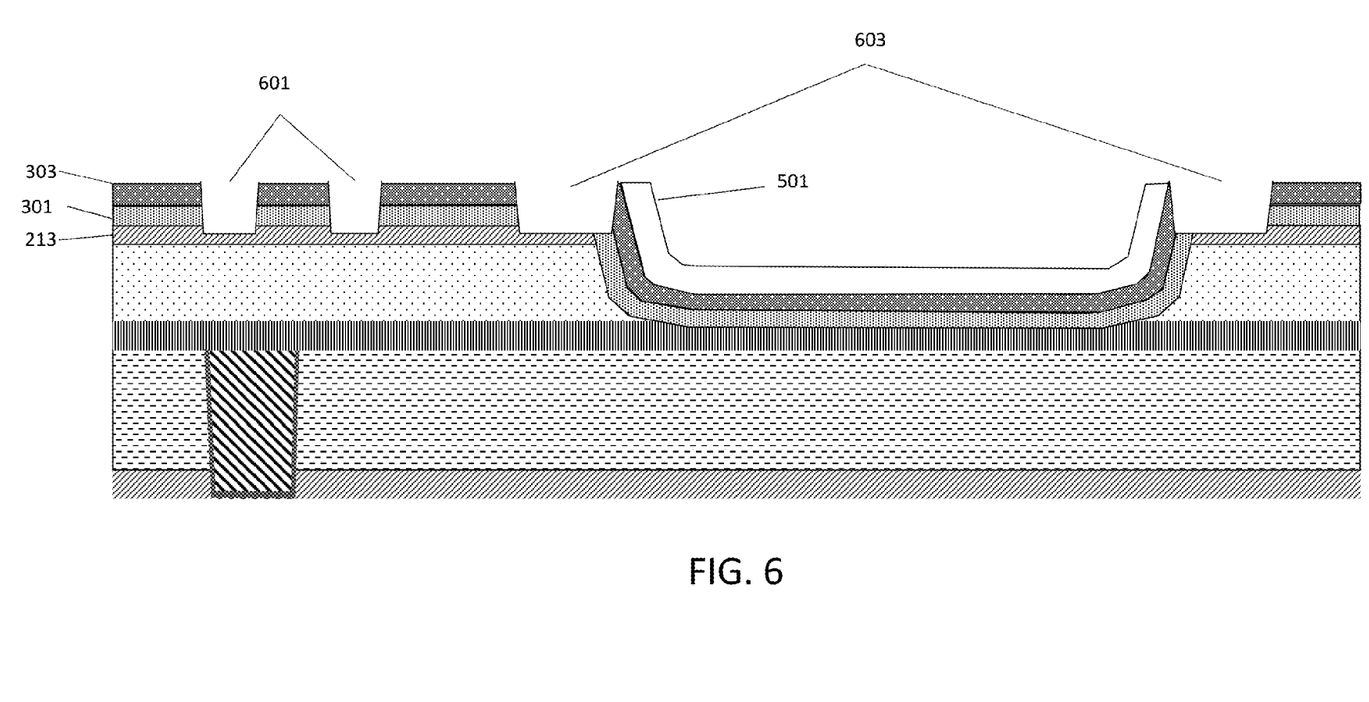

As illustrated in FIG. 6, metal line trenches 601, 603 and are formed through the oxide hard mask 303 and metal hard mask 301 down to the hard mask layer 213, while the inductor trench is masked (not shown for illustrative convenience). Metal line trenches 603 are formed on opposite sides of the inductor trench 215. A single or double patterning process can be used to form the metal line trenches 601, 603.

Figure 7:
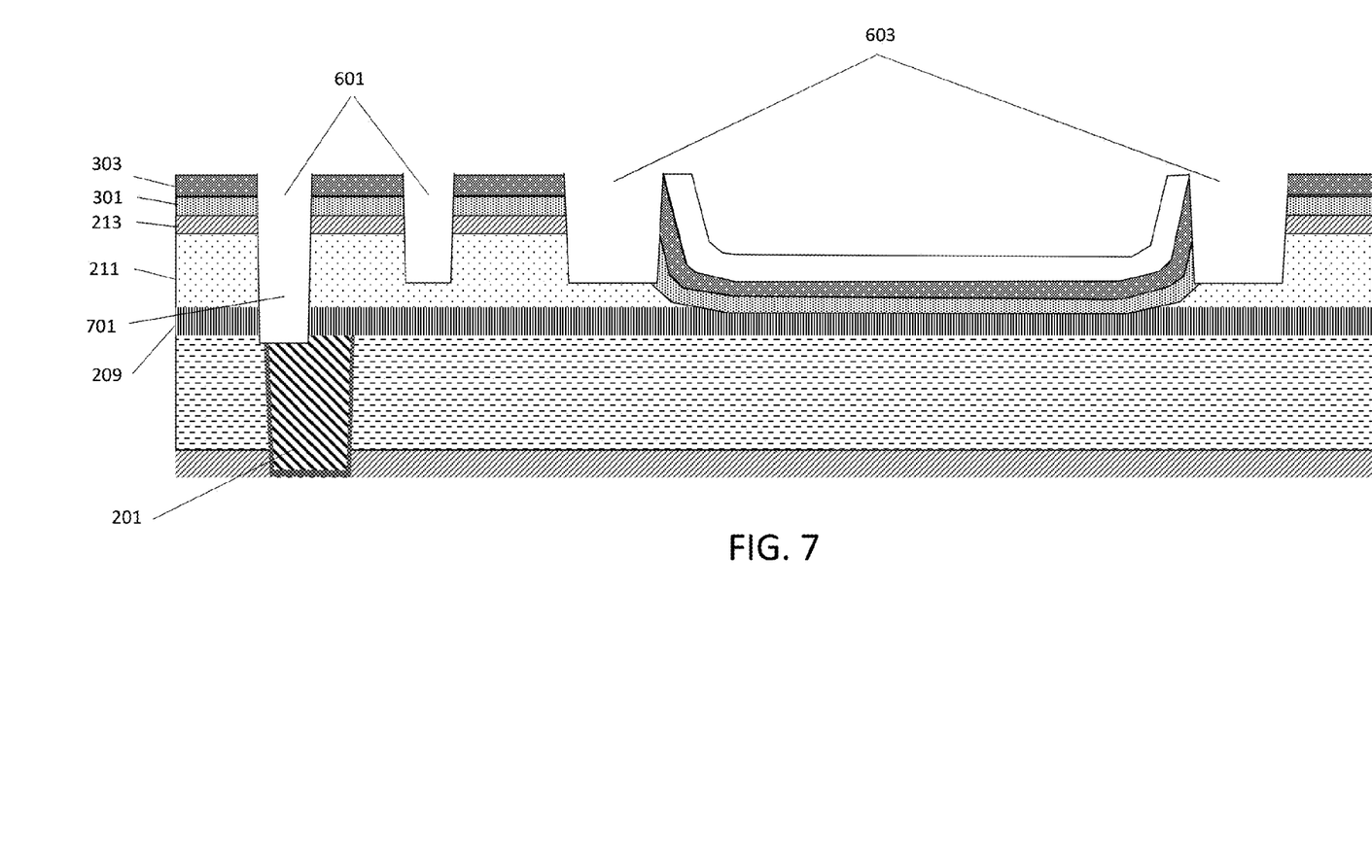

In FIG. 7, an etching step is performed to extend the metal line trenches 601, 603 through the hard mask layer 213 into the dielectric layer 211. A via 701 is formed through one of the metal line trenches 601 down through the etch stop layer 209 to the contact 201. The via 701 is extended with a reactive ion etch using, for example, carbon tetrafluoride, but other etchants can be used. To form via trench 701, another via mask is used prior to an etching process which is not drawn in this figure, and which is well known as "metal first dual damascene patterning process".

Figure 8:
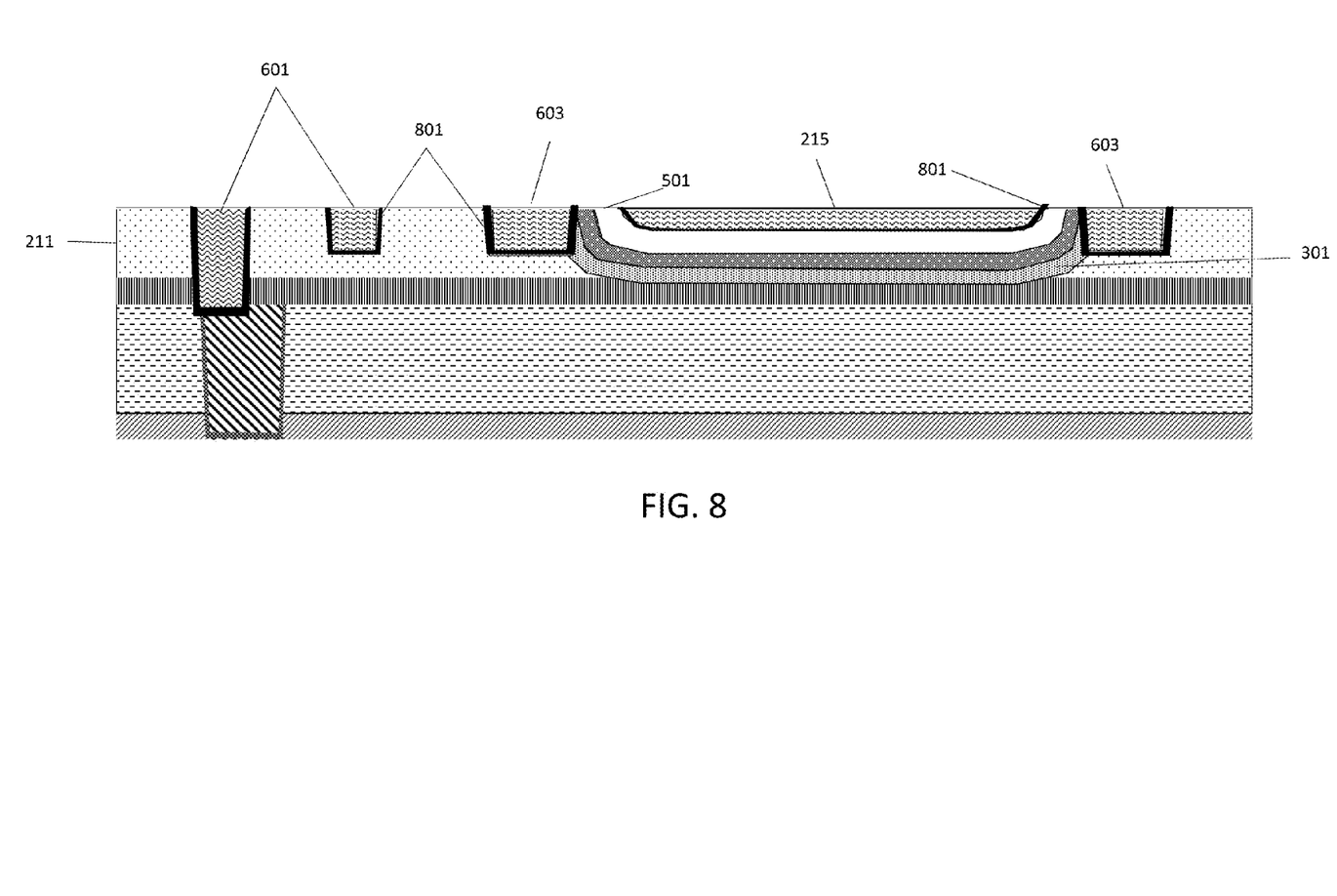

As shown in FIG. 8, the metal line trenches 601, 603, via 701 and inductor trench 215 may next be filled with metal. For example, the metal line trenches 601, 603, via 701 and inductor trench 215 may filled with copper, but other metals may be used. One technique for filling the metal line trenches 601, 603, via 701 and inductor trench 215 with copper includes the damascene or dual damascene process. In addition, a barrier metal and seed layer 801 may be first formed overlying the exposed surfaces, and then a metal core may be formed overlying the barrier metal and seed layer 801. The barrier metal and seed layer 801 may improve adhesion of the metal to dielectric materials and thereby improve reliability. The barrier metal and seed layer 801 may be formed of copper and manganese deposited by physical vapor deposition (PVD) using copper amidinate and manganese amidinate. Alternatively, the barrier metal and seed layer 801 may be formed from titanium, titanium nitride, or other materials. The metal such as copper may then be deposited, such as by electroplating. The metal may be 90 mass percent or more copper, and various copper alloys can be used, some of which include less than 90 mass percent copper. The metal line trench 601 and via 701 once filled form an electric connection with the contact 201. The simultaneous filling of the metal line trenches 601, 603, via 701 and inductor trench 215 reduces the number of manufacturing steps over processes that form these components separately. Alternatively, the metal filling the inductor trench 215 can be a metal different from that used in the metal line trenches 601, 603 and via 701, which, for example, can be filled with copper while the inductor trench 215 can be filled by tungsten or gold.

In filling the metal line trench, via, and inductor trench, an overburden is generally formed. The overburden and excess material is removed, such as by CMP, as illustrated in FIG. 8. The oxide hard mask 303, metal hard mask 301 and hard mask 213 are also removed with the planarization step. Thus, the upper surface of the metal filled inductor trench 215 becomes substantially coplanar with an upper surface of the dielectric layer 211.

As shown in FIG. 8, the inductor bottom metal includes the remaining portion of the metal hard mask 301. The inductor core includes the metal filled inductor trench 215. Metal filled trenches/contacts 603 serve as via connect points for the inductor bottom metal and the inductor top metal (discussed below with respect to FIGS. 9 through 12).

Figure 9:
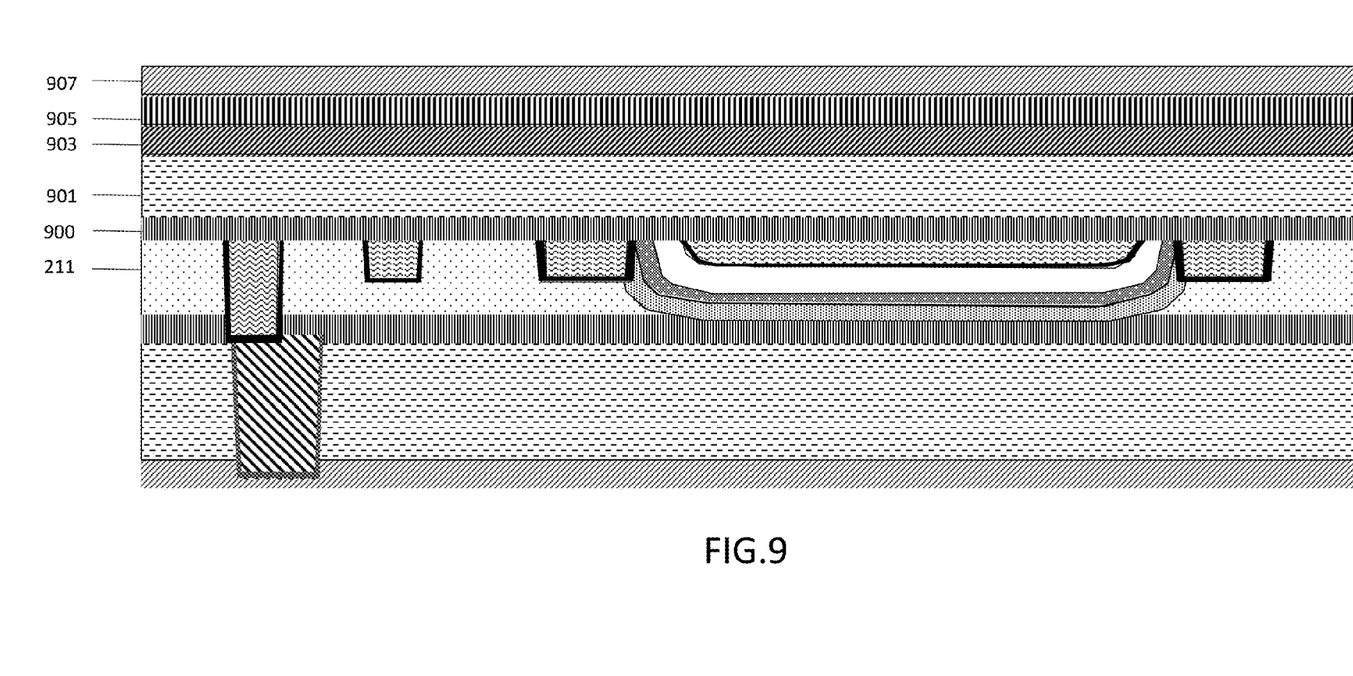

Referring to FIG. 9, an etch stop layer 900 is formed overlying dielectric layer 211. The etch stop layer 900 may be silicon nitride, but other materials can also be used. For example, an etch stop layer with the general formula $SiC_xN_yH_z$ is useful in preventing copper migration, such as is common during annealing. Thus, etch stop layer 900 serves as a diffusion barrier layer. A second dielectric layer 901 is formed over the etch stop layer 900. The dielectric layer 901 is, for example, silicon dioxide ($SiO_2$), but other electrically insulating materials can also be used. The $SiO_2$ for the dielectric layer 901 may be deposited using OMCTS as a precursor, for instance with silane with a plasma provided at 50 W to 3000 W of RF power at a frequency of about 13.56 MHz or 350 KHz. This exposure is followed with an oxygen purge using an oxygen containing gas, such as oxygen gas or nitrous oxide, and a plasma provided at 50 W to 3000 W for 0.1 seconds to 600 seconds. The OMCTS and purge steps can be repeated until the dielectric layer 901 is at the desired thickness, such as 50 nm to 500 nm. Alternatively, the dielectric layer 901 may be deposited by PECVD using dichlorosilane, silane, or TEOS as precursors, or other known lower dielectric constant (low-k) $SiO_2$ deposition techniques.

A hard mask layer 903 is optionally formed overlying the dielectric layer 901. The hard mask layer 903 may, for example, be $SiO_2$ formed using ozone and TEOS as precursors in a CVD at less than atmospheric pressure, but other materials or other methods of forming $SiO_2$ can also be used. The hard mask layer 903 and the dielectric layer 901 are both electrically insulating materials.

A metal hard mask 905 is formed overlying the dielectric layer 901 and the mask layer 903 (if present). The metal hard mask 905 is formed from an electrically conductive metallic material. For example, the metal hard mask 905 is TiN, but other materials can also be used. TiN can be formed by CVD using tetramethylamidotitanium and nitrogen trifluoride at a pressure of 0.1 to 10 torr and a temperature of about 500° C., but other deposition processes are also possible. An oxide hard mask 907 is formed overlying the metal hard mask 905. The oxide hard mask 907 may be conformally formed from $SiO_2$, which may be deposited using TEOS, as described above. Other insulating materials can alternatively be used for the oxide hard mask 907. For example, the oxide hard mask 907 may have a thickness of from 5 nm to 50 nm.

Figure 10:
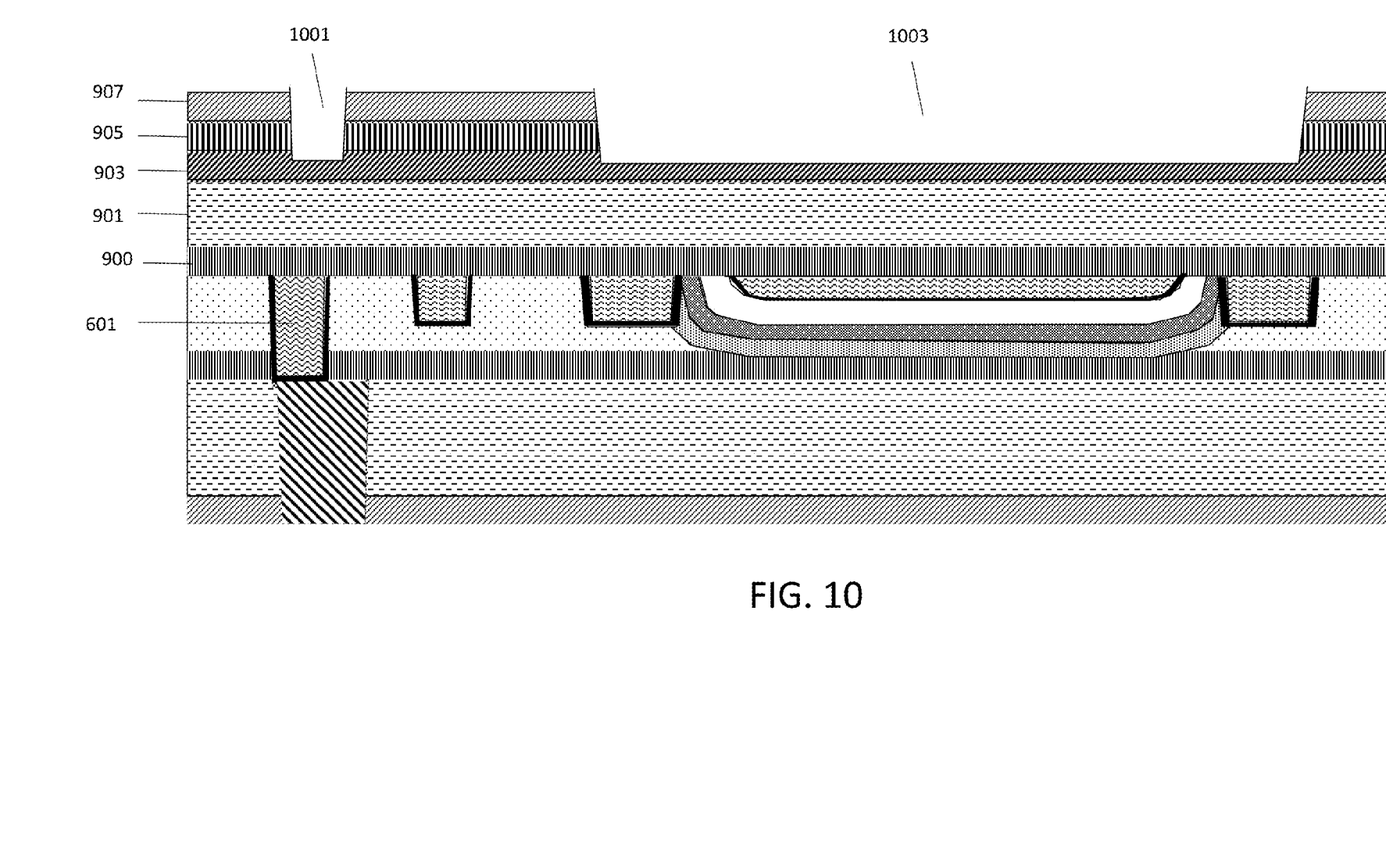

As shown in FIG. 10, a metal line 1001 overlying contact 201 and an inductor trench 1003 are formed through the oxide hard mask 907 and metal hard mask 905 to the hard mask layer 903. The metal line 1001 and inductor trench 1003 may stop on top of the hard mask layer 903, or may extend partially into or fully through the hard mask layer 903. The inductor trench 1003 is formed to have a tapered rectangular trench shape.

Figure 11:
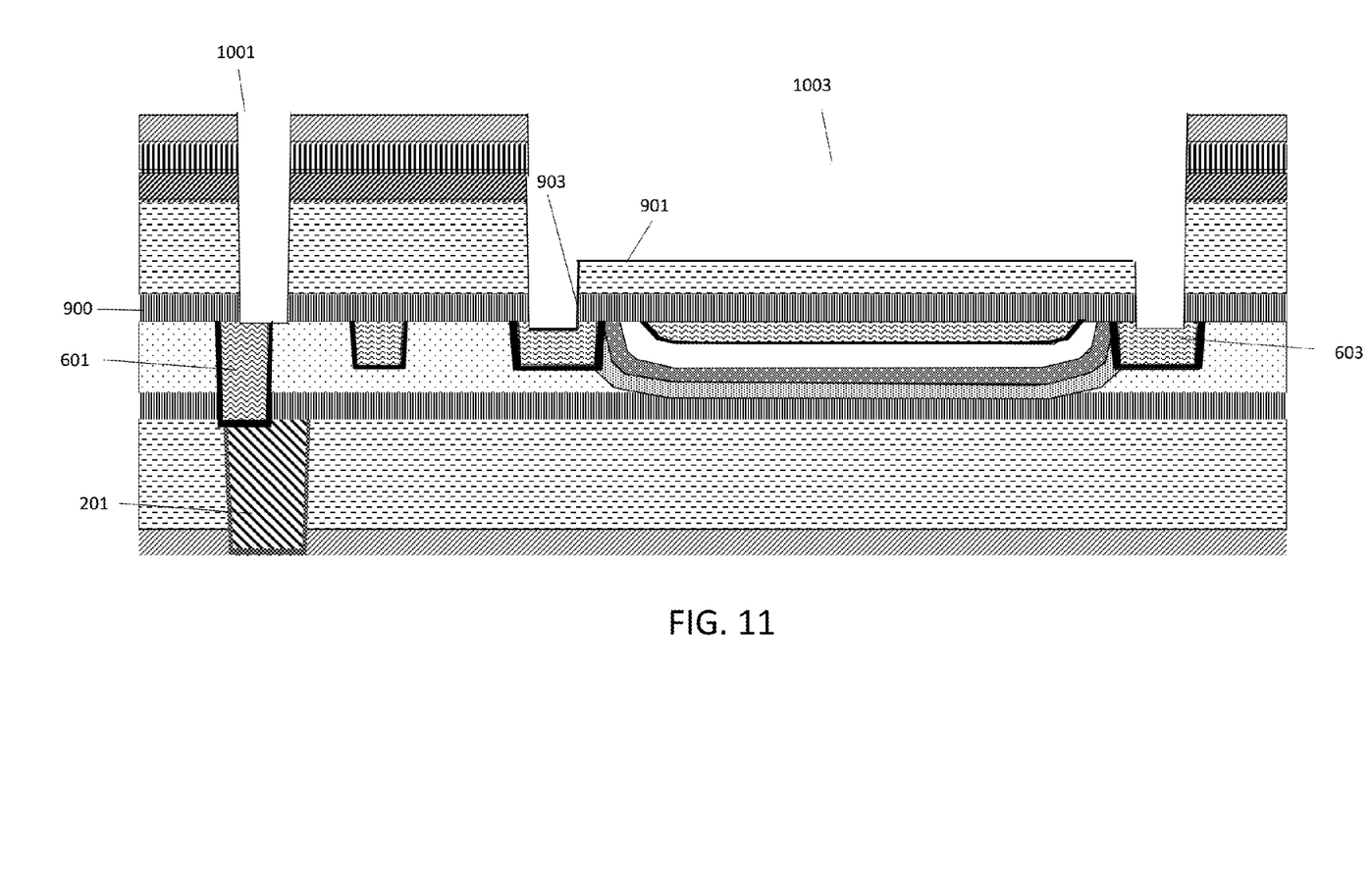

As shown in FIG. 11, the metal line 1001 and an inductor trench 1003 are extended down to the dielectric layer 901. An etching step is performed to extend the metal line trench 1001 into the dielectric layer 901 and to form a via through the metal line trench 1001 down to the metal line trench 601. The via is extended with a reactive ion etch using, for example, carbon tetrafluoride, but other etchants can be used. During the same etching step, the inductor trench 1003 is extended to the dielectric layer 901, and a portion of the dielectric layer in the inductor trench 1003 is removed during etching. Vias on both sides of the inductor trench 1003 extend down to the metal line trenches 603. To form vias on both sides of the inductor trench and through the metal line trench 1001, another via mask is used prior to an etching process which is not drawn in this figure, and which is well known as "metal first dual damascene patterning process".

Figure 12:
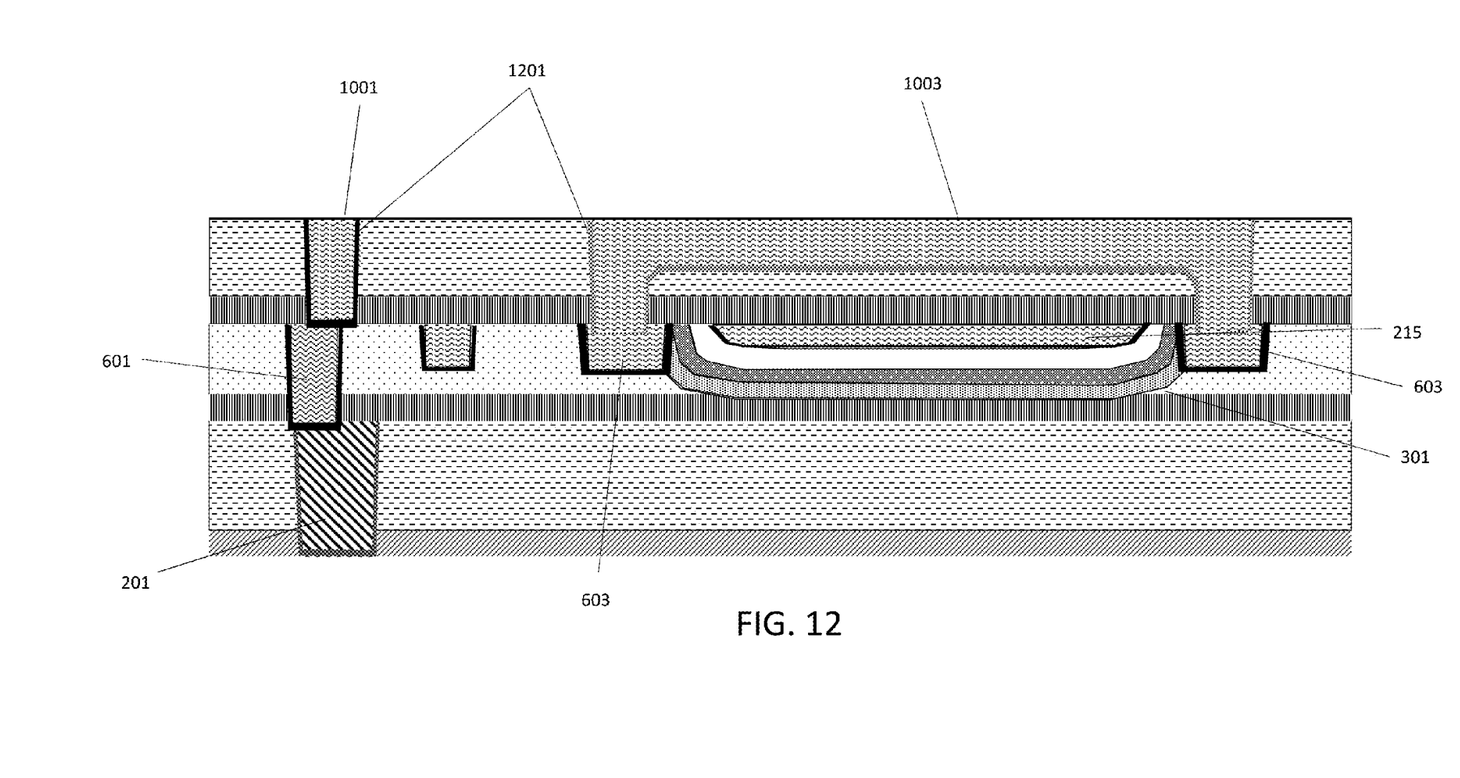

Referring to FIG. 12, the metal line trench 1001, vias and inductor trench 1003 may next be filled with metal. For example, the metal line trench 1001, via and inductor trench 1003 may include copper, but other metals may be used. One technique for filling the metal with copper includes the damascene or dual damascene process. In addition, a barrier metal and seed layer 1201 may be formed overlying the exposed surfaces, and then a metal core may be deposited overlying the barrier metal and seed layer 1201 such as by electroplating. The metal line trench 1001 and via once filled form an electric connection with the metal line trench 601 and contact 201. The simultaneous filling of the metal line trench 1001, via and inductor trench 1003 reduces the number of manufacturing steps over processes that form these components separately.

In filling the metal line trench, via, and inductor trench, an overburden is generally formed. The overburden and excess material is removed, such as by CMP, as illustrated in FIG. 12. The oxide hard mask 907, metal hard mask 905, and hard mask 903 are also removed with the planarization step. Thus, the upper surface of the inductor trench 1003 becomes substantially planar with an upper surface of the dielectric layer 901 following the planarization step.

The inductor top metal includes the metal filled trench 1003. The inductor bottom metal includes the remaining portion of the metal hard mask 301. The inductor core includes the metal filled inductor trench 215. Metal filled trenches 603 serve as via connect points for the inductor bottom metal and the inductor top metal 1003.

Figure 13A:
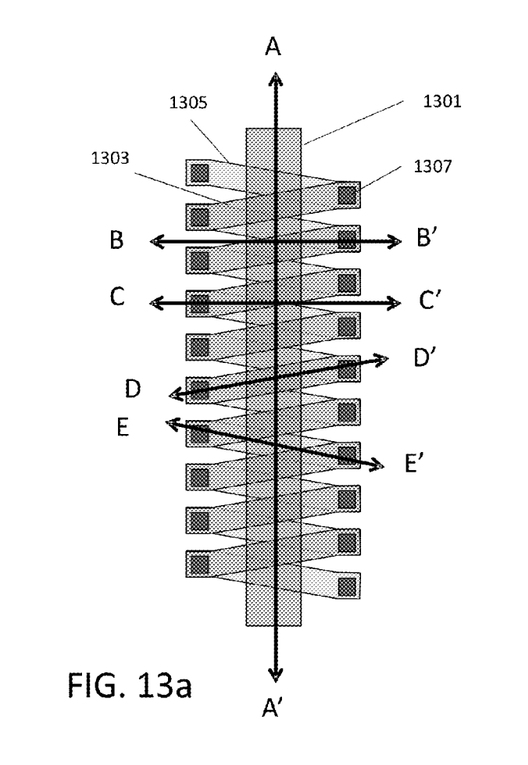
FIGS. 13a through 13f illustrate several views of a single core inductor, in accordance with an exemplary embodiment.
Figure 13B:
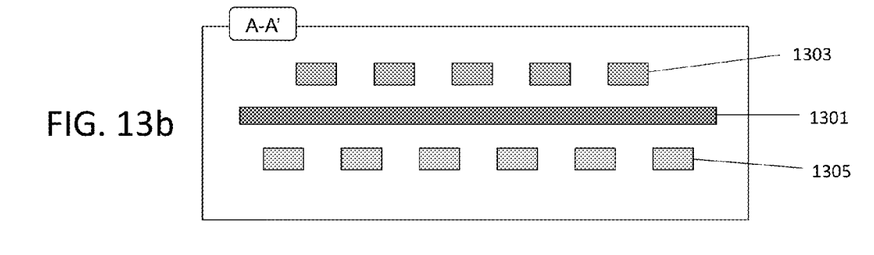
Figures 13C, 13D:
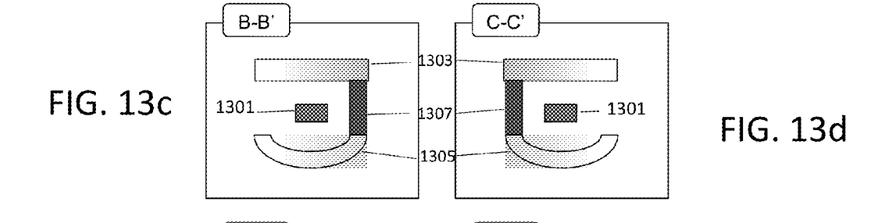
Figures 13E, 13F:
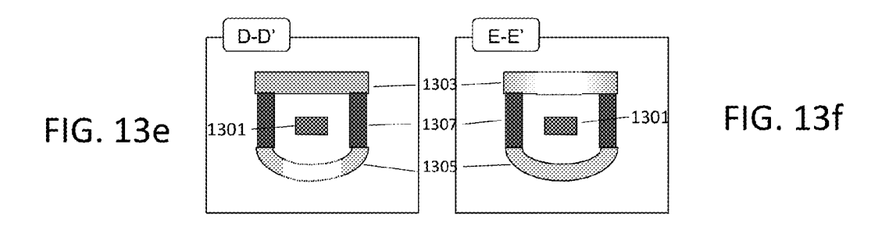

FIGS. 13a through 13f provide several views of the spiral-shaped single core inductor produced with the foregoing methodology. In FIGS. 13a and 13b, line A-A' passes through a longitudinal direction of the inductor core 1301, with the inductor upper metal 1303 and inductor lower metal 1305 surrounding the inductor core 1301. FIGS. 13a, 13c and 13d illustrate lines B-B' and C-C' showing cross-sectional views of the inductor with connections between the inductor upper metal 1303 and inductor lower metal 1305 by way of vias 1307 and inductor core 1301 disposed in the middle. Similarly, FIGS. 13a, 13e and 13f illustrate lines D-D' and E-E' showing cross-sectional views of the inductor with connections between the inductor upper metal 1303 and inductor lower metal 1305 by way of vias 1307 and inductor core 1301 disposed in the middle.

The embodiments of the present disclosure can achieve several technical effects, such as formation of non-magnetic single core inductors with a high quality Q factor and ideal thickness which meets industry demands for miniaturization. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming an inductor trench in a first dielectric layer;
    forming a first metal-oxide hard mask by disposing a metal hard mask and an oxide hard mask over the first dielectric layer and in strips in the inductor trench;
    forming first metal line trenches through the first metal-oxide hard mask and into the first dielectric layer on opposite sides of the inductor trench and first vias through both the first metal-oxide hard mask and the first dielectric layer;
    filling the first metal line trenches, first vias, and inductor trench and removing the first metal-oxide hard mask from the first dielectric layer;
    forming a second dielectric layer and a second metal-oxide hard mask over the filled inductor trench, first vias and first metal line trenches and the first dielectric layer;
    forming a second trench through the second metal-oxide hard mask and into the second dielectric layer and second metal line trenches and second vias through both the second metal-oxide hard mask and the second dielectric layer down to the first metal line trenches and first vias, respectively; and
    filling the second metal line trenches, second vias, and second trench.

2. The method of claim 1, further comprising:
    disposing the first dielectric layer over an interlayer dielectric (ILD), the ILD including a contact therethrough.

3. The method according to claim 2, further comprising:
    disposing a diffusion barrier layer between the ILD and the dielectric layer.

4. The method according to claim 3, further comprising:
    disposing a hard mask over the first dielectric prior to forming the inductor trench.

5. The method of claim 1, wherein:
    the metal in the metal-oxide hard mask forms the inductor bottom metal,
    the filling of the inductor trench includes filling the inductor trench with an inductor core metal, and
    the filling of the second trench includes filling the second trench with an inductor top metal.

6. The method according to claim 1, wherein the conformal oxide liner comprises tetraethyl orthosilicate (TEOS).

7. The method according to claim 1, comprising forming the inductor trench with a round or u-shaped bottom.

8. The method according to claim 1, comprising:
    filling the first metal line trenches, first vias, and inductor trench by a damascene or dual damascene process.

9. The method according to claim 8, further comprising:
    prior to filling the first metal line trenches, first vias, and inductor trench, depositing a barrier layer in the first metal line trenches, first vias, and inductor trench.

10. The method of claim 9, wherein the filling the first metal line trenches, first vias, and inductor trench comprises:
    filling the first metal line trenches, first vias, and inductor trench with copper, tungsten or gold.

11. The method of claim 1, wherein the filling the second metal line trenches, second vias, and second trench, includes:
    filling the second metal line trenches, second vias, and second trench with a conductive material selected from copper, tungsten or gold.

12. A method comprising:
    disposing a dielectric layer over an interlayer dielectric (ILD), the ILD including a contact;
    forming an inductor trench in the first dielectric layer;
    forming a first metal-oxide hard mask over the first dielectric layer and in the inductor trench by disposing a metal hard mask followed by an oxide hard mask;
    etching the metal-oxide hard mask in the inductor trench, forming strips;

forming first metal line trenches through the first metal-oxide hard mask on opposite sides of the inductor trench, while masking the inductor trench with a conformal oxide liner;

etching through the metal-oxide hard mask to extend some first metal line trenches into the first dielectric layer and other first metal line trenches through the first dielectric layer to form;

removing the first metal-oxide hard mask from the first dielectric layer;

filling the first metal line trenches, first vias, and inductor trench with a first metal;

forming a diffusion barrier, a second dielectric layer, and a second metal-oxide hard mask over the metal filled inductor trench, first vias, and first metal lines and the second dielectric layer;

forming a second trench through the second metal-oxide hard mask into the second dielectric layer;

etching through the second metal-oxide hard mask, second dielectric layer, and diffusion barrier to form second metal line trenches on opposite sides of the second trench and second vias down to the first metal line trenches and first vias, respectively, wherein a portion of the second dielectric layer and diffusion barrier remains over the inductor trench filled with the first metal; and filling the second metal line trenches, second vias, and second trench with a second metal.

13. The method according to claim 12, further comprising:

prior to filling the first metal line trenches, first vias, and inductor trench with a first metal, depositing a barrier layer in the first metal line trenches, first vias, and inductor trench.

14. The method according to claim 12, comprising:

filling the first metal line trenches, first vias, and inductor trench with the first metal by a damascene or dual damascene process.

* * * * *